United States Patent

Talbert

[15] 3,651,565

[45] Mar. 28, 1972

[54] LATERAL TRANSISTOR STRUCTURE AND METHOD OF MAKING THE SAME

[72] Inventor: David V. Talbert, Santa Cruz, Calif.

[73] Assignee: National Semiconductor Corporation, Santa Clara, Calif.

[22] Filed: Sept. 9, 1968

[21] Appl. No.: 758,340

[52] U.S. Cl. ....................................29/590, 29/576, 148/1.5

[51] Int. Cl. ......................................... B01j 17/00, H01l 7/24

[58] Field of Search....................29/589, 590, 591, 578, 571, 29/576; 317/235, 21.1, 46, 40.1, 40.12

[56] References Cited

UNITED STATES PATENTS

| | | | |
|---|---|---|---|
| 3,470,609 | 10/1969 | Breitweiser | 29/571 |
| 3,472,703 | 10/1969 | Ono | 317/235 C |
| 3,491,273 | 1/1970 | Stiegler | 317/235 AC |
| 3,445,924 | 5/1969 | Cheroff et al. | 29/571 |
| 3,401,319 | 9/1968 | Watkins | 317/235 Y |
| 3,445,734 | 5/1969 | Pecoraro | 317/235 X |
| 3,320,651 | 5/1967 | Kauppila et al. | 29/571 |
| 3,382,568 | 5/1968 | Kuiper | 29/590 |
| 3,508,324 | 4/1970 | Idzik et al. | 29/589 |

*Primary Examiner*—John F. Campbell
*Assistant Examiner*—W. Tupman
*Attorney*—Lowhurst & Hamrick

[57] ABSTRACT

A process for making a lateral PNP semiconductor device having a $\beta$ within the range of 5 to 500 wherein, during a heating stage, a metallic layer is left covering the surface of the wafer above substantially all of the base region separating the emitter and collector regions. The resultant effect is to cause a marked increase in the current gain of the transistor thus constructed over those similar devices manufactured in accordance with prior art processes.

6 Claims, 8 Drawing Figures

INVENTOR
DAVID V. TALBERT
BY
Harvey J. Fairbank
ATTORNEY

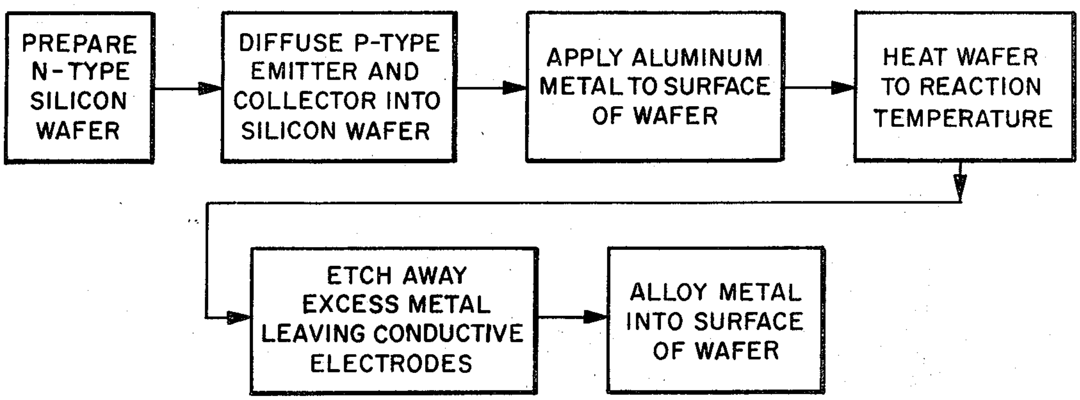
Fig_6
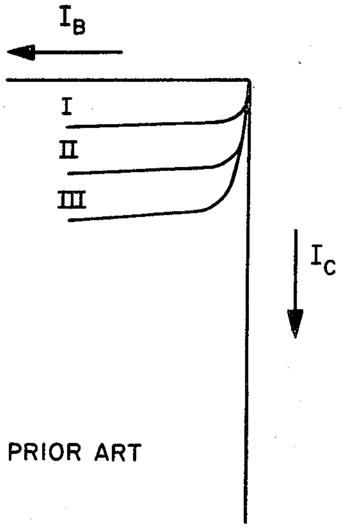
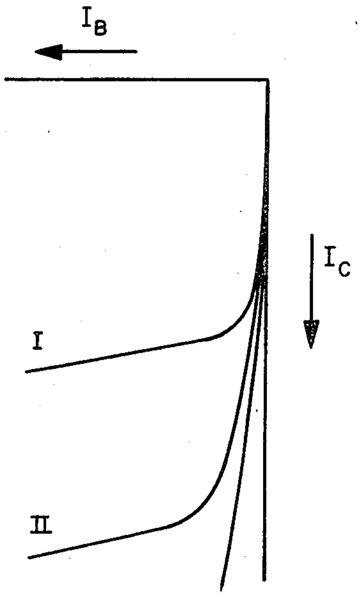
Fig_7A Fig_7B
*INVENTOR*
DAVID V. TALBERT
*BY* Harvey G. Lenchert
*ATTORNEY*

LATERAL TRANSISTOR STRUCTURE AND METHOD OF MAKING THE SAME

BACKGROUND OF THE INVENTION

STATEMENT OF THE INVENTION

The invention relates generally to the field of semiconductor manufacture and more particularly to a process for making a lateral transistor having a higher than normal current gain characteristic as compared to physically similar prior art devices of the same type structure.

DESCRIPTION OF THE PRIOR ART

Heretofore lateral transistors of the PNP type with useful breakdown voltages (BV) above 30 volts have typically had current gains ($\beta$) of within the range of 1 to 5. These transistors are usually manufactured by diffusing into an N-type substrate two areas of P-type impurity so as to provide an emitter and collector region with the separating substrate serving as the base region. After the diffusion process has been completed in the areas where ohmic contacts are to be formed, openings are cut into the oxide above the base, emitter and collector regions using a photo-resist or other suitable technique.

The wafer is then cleaned and placed in a vacuum evaporation apparatus wherein a thin film of aluminum metal is deposited over the entire surface of the wafer including the contact areas which have been cut through the oxide coating. The wafer is subsequently removed from the vapor deposition apparatus, and the major portion of the deposited aluminum is etched away leaving only narrow strips which are to serve as lead-in conductors to the base, emitter and collector regions. The thusly prepared wafer is thereafter placed in an oven and heated at a predetermined temperature for a predetermined period of time so that the respective metal conductor strips are alloyed into the surface of the wafer at those places where the desired ohmic contact is intended. The oxide coating insulates the strips from the remaining areas. Upon the completion of the alloying process the transistor structure is completed and is ready for utilization.

As mentioned above, a semiconductive structure of the type described has a typical $\beta$ of from 1 to 5. If it were possible, however, to increase the $\beta$ range, the field of utilization of the device would be increased many fold, and the device would find application in areas in which it was heretofore not usable.

SUMMARY OF THE INVENTION

It is therefore a principal object of the present invention to provide an improved method of manufacture of semiconductive elements which produces a structure having substantially higher current gain characteristics than similar elements made in accordance with prior art methods.

Another object of the present invention is to provide an improved method of making lateral PNP type transistors having a substantially higher $\beta$ than that of similar devices made in accordance with prior art methods.

Still another object of the present invention is to provide an improved technique for producing integrated circuit components having certain characteristics heretofore unavailable in the prior art. In accordance with the present invention, a process is disclosed for the manufacture of a bipolar PNP semiconductor device having a current gain ($\beta$) within the range of 5 – 500. The process includes preparing a body of N-type silicon; diffusing separated P-type emitter and collector regions into different portions of one surface of the body; forming an oxide coating over the one surface; providing openings in the oxide coating above the emitter region, the collector region and a portion of the one surface lying outside of the emitter, collector and base regions; depositing a layer of metallic material over the oxide coating and into the openings; and heating the body to a predetermined temperature less than the eutectic temperature of the layer of metallic material and silicon for a predetermined time.

Still other objects and advantages of the present invention will become apparent after having read the following specification which describes preferred methods and apparatus which are illustrated in the drawing wherein:

BRIEF DESCRIPTION OF THE DRAWINGS

FIG. 6 is a flow diagram illustrating certain steps involved in making semiconductors in accordance with the present invention; and FIGS. 7*a* and 7*b* illustrate characteristic curves of transistors made in accordance with the subject invention as compared with those of the prior art.

DESCRIPTION OF THE PREFERRED EMBODIMENT

Figure 1:
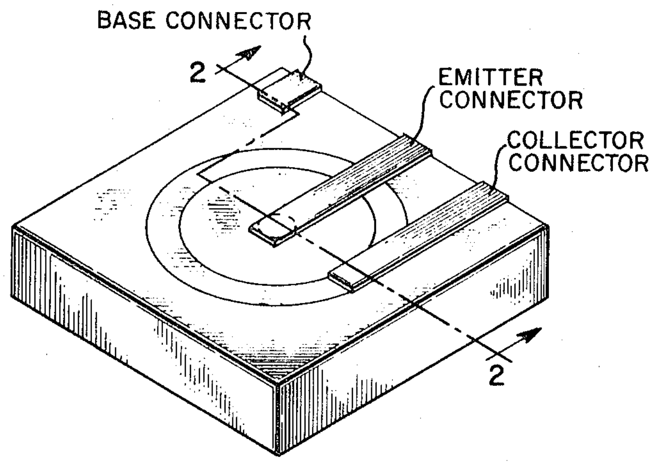
FIG. 1 illustrates a semiconductive structure made in accordance with prior art methods.
Figure 2:
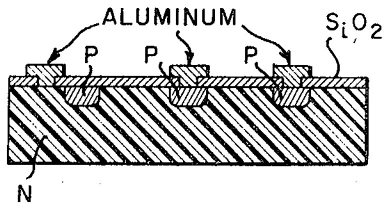
FIG. 2 is a cross section taken through the structure of FIG. 1.
Figure 3:
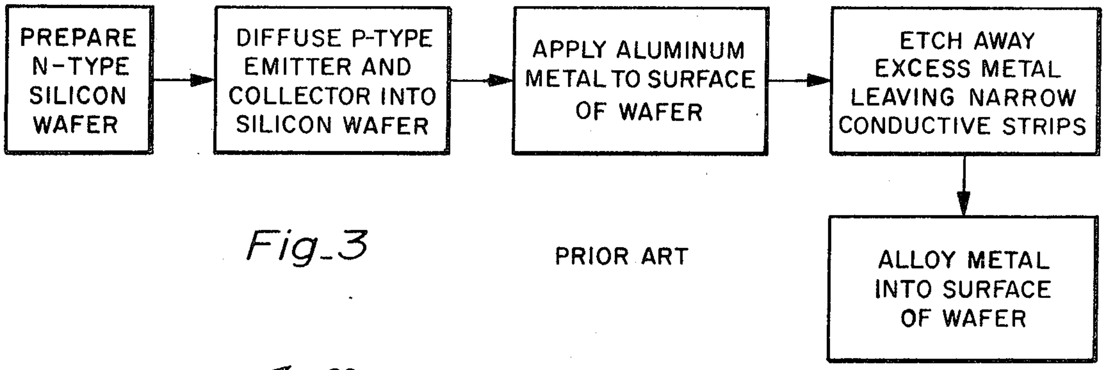
FIG. 3 is a flow diagram illustrating certain essential steps of the prior art method used in making the structure of FIGS. 1 and 2.

Referring now to the drawing, FIGS. 1 and 2 illustrate a typical prior art lateral transistor structure, and FIG. 3 is a flow chart illustrating a method of making the structure in accordance with the prior art. The essential steps involved in the prior art manufacturing process are adequately described in the discussion above and need not be repeated here.

Figure 4:
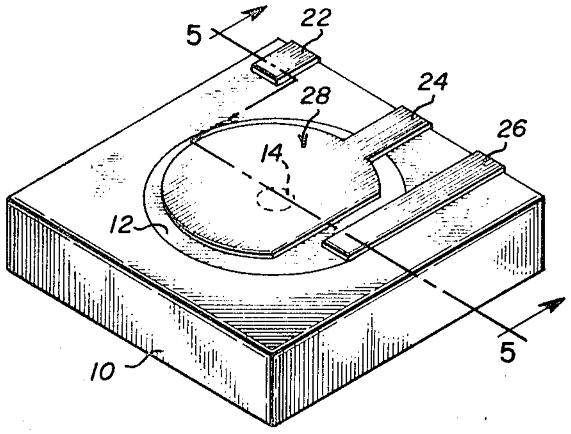
FIG. 4 illustrates a semiconductive structure made in accordance with the present invention.
Figure 5:
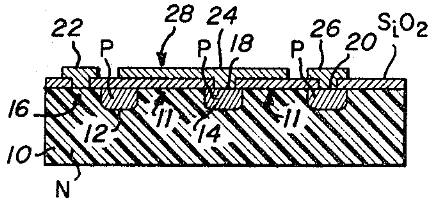
FIG. 5 is a cross section taken through the structure of FIG. 4.

In FIGS. 4 and 5 there is shown a preferred embodiment of a lateral transistor structure made in accordance with the present invention, and which, by virtue of applicant's novel method of manufacture, has a $\beta$ in the range of 5 to 500. It will be noted that the new structure is generally similar to that of the prior art device shown in FIGS. 1 and 2 in that it includes a silicon wafer 10 doped with N-type impurities and into which are diffused a first generally annular region 12 of P-type impurities and a second circular region 14 also of P-type impurities. On the upper surface of the wafer 10 is a thin layer of oxide ($SiO_2$) through which openings are cut, usually by etching, to expose the semiconductive surface so that the connectors 22, 24 and 26 may be extended therethrough to form ohmic contacts at 16, 18 and 20 respectively.

In forming the ohmically contacting connectors 22, 24 and 26, an aluminum film is deposited over the apertured $SiO_2$ surface. The connectors are then alloyed into the N, P and P-type regions respectively, so as to form the ohmic contacts to the respective regions. The contacts and their conductive areas 22, 24 and 26 are subsequently separated by an etching process which removes the unwanted material. The structure thus formed comprises a lateral PNP transistor wherein the N-type portion of wafer 10 is the base region, the P-type diffusion 12 is the collector region and the P-type diffusion 14 is the emitter region.

It will be noted that the connector 24 in the illustrated embodiment is so large as to completely cover substantially all of the annular region 11 of base 10 separating the emitter region 14 from the collector region 12. This is not necessarily required in the case of the finished product, but is quite important during the manufacturing process which is to be described below. It should also be pointed out here that although the emitter and collector regions are shown as being generally circular in shape, they can take any suitable form consistent with good integrated circuit design.

The integrated circuit process of the present invention is quite similar to the prior art processes in the primary stages. The silicon substrate is first doped with N-type material so as to produce an N-type silicon wafer 10. The collector and emitter regions 12 and 14 are then diffused into the wafer 10 so as to form PNP junctions comprising a lateral transistor structure.

During the diffusion process an oxide coating is formed over the upper surface of the wafer. This oxide is typically silicon dioxide ($SiO_2$) and serves to electrically insulate the P and N regions from externally applied voltages. At the point where it is desired to provide ohmic contacts, the oxide layer must be removed. This is usually accomplished by means of a photoresist type process which is well-known in the art, and allows the oxide to be stripped away in the desired areas without detrimentally affecting the wafer itself.

Because it has been found impractical to attach wires directly to the silicon wafer, an intervening metal film is nearly always employed. The desirable properties of this film are that it be capable of making a good ohmic contact with the semiconductor, that it be an excellent conductor, and that it have metallurgical properties suitable for external lead attachment. The most common metals used are gold, aluminum, titanium, platinum, nickel, silver and chromium.

Once the oxide has been stripped away in the desired contact areas, a film of the chosen metal is deposited over the entire upper surface of the wafer. Up to this point the process has not varied from that typically followed by the prior art. But whereas the next step in the typical prior art method is to etch away the unwanted areas of the metallic film, leaving only narrow conductive strips for conducting electrical current from the lead connection points to the ohmic contact points of the base, emitter and collector, the next step of the present invention following the deposition of the metallic film is to heat the film and wafer to a temperature below the eutectic temperature of the film and semiconductor for a time adequate to cause the desired reaction at the selected temperature. One example is to heat the wafer and film at 570° C. for 15 minutes. Preferred ranges of temperatures and times are between 550° and 570° C. for periods between 30 minutes and 15 minutes.

After the heating process, which may or may not be sufficient to cause alloying of the metal film to the wafer, the unwanted metallic material is then etched away from the surface of the wafer so as to leave only the desired conductive strips to which the external connections can be made. In some cases it may be more desirable at this stage to heat the wafer to a temperature less than enough to cause the metal film to be alloyed into the wafer. In such a case the alloying stage would typically follow the last etching step. During this subsequent alloying stage good ohmic contacts would be formed between the metal film and the semiconductive components. As an alternative to the process, in accordance with the present invention, the etching process can actually be carried out prior to the heating step providing a metallic surface region is left substantially covering the entire base area 11 separating the emitter and collector regions as shown at 28.

The effect of having the metallic layer 28 disposed over the N-type region separating the two P-type regions during either an intermediate heating step or the alloying process is that the current gain ($\beta$) characteristics of the resulting semiconductor structure are markedly improved over those made according to the prior art process wherein the separating base region is not substantially covered with the metallic material during the heating process. For example, in FIG. 7*a* the current gain characteristics of a structure made using the prior art process are illustrated. In contrast, a physically similar structure made in accordance with the present invention will exhibit current gain characteristics such as are illustrated in FIG. e7*b*. By comparing the corresponding curves I and II of the two FIGS. 7*a* and 7*b* the considerable improvement in gain can be seen.

The reason for the improvement in gain characteristic produced by having the base region covered with the metallic film during the heating process is as yet unexplained. It is suspected, however, that some unknown phenomenon occurs in the sandwiched oxide coating, or in the adjacent boundary regions of the doped semiconductor, during the heating stage performed prior to the removal of the metal layer covering the base region. The effect can be closely analogized to the gettering process used to remove the last vestiges of gas within a vacuum tube after it has been exhausted in that in both processes the operation of the device is markedly improved.

The improvement in gain which is achieved by using the method of the present invention is indeed substantial. As previously mentioned, whereas the $\beta$ of a prior art transistor structure is in the range of 1 to 5, the $\beta$ of a physically similar structure made in accordance with the present invention has a $\beta$ in the range of 5 to 500.

Although the above discussion of the inventive process has been more or less limited to PNP type transistor structures for purposes of illustration, it will be appreciated that the same process will be applicable to the manufacture of NPN-type transistors and integrated circuits having similar physical characteristics. And, furthermore, while the invention has been described with reference to a method incorporating the several illustrative steps, it will be apparent to those of skill in the art that certain modifications can be made to the process without departing from the merits of the present invention.

It is therefore to be understood that the particular process described is not invariable, and that the method disclosed for illustrative purposes is not to be limited to the specific steps recited. Furthermore, I intend that the appended claims be interpreted as covering all modifications of the process which fall within the true spirit and scope of my invention.

What is claimed is:

1. A process for the manufacture of a bipolar lateral transistor of PNP-type having a current gain $\beta$ in excess of 5, comprising the steps of:

preparing a body of N-type silicon;

diffusing P-type emitter and collector regions into spaced portions of one surface of said body, the undiffused portions of said body defining a base region;

forming an oxide coating over said one surface;

depositing a layer of metallic material over substantially the entire portion of the coating covering that part of the base region located between the emitter and collector regions;

heating said body to a predetermined temperature close to but less than the eutectic temperature of said layer of metallic material and silicon for a predetermined time while the metallic layer is covering said part of the base region, so as to increase the current gain of the transistor; and during the manufacturing process, providing an opening in said oxide coating above each of said regions and an electrode passing through each opening to ohmically contact said regions.

2. A process for the manufacture of a bipolar lateral transistor as recited in claim 1 wherein during said heating step said body is heated to between 550° and 570° C. for between 30 minutes and 15 minutes.

3. A process for the manufacture of a bipolar lateral transistor as recited in claim 1 and further comprising the step of removing the portion of said layer of metallic material covering said base region following said heating step.

4. A method of increasing the current gain $\beta$ of a bipolar lateral transistor structure including a semiconductive body having at least two spaced-apart, diffused regions disposed beneath and contiguous with one surface of said body and defining, respectively, the emitter and collector regions of the transistor, with the undiffused portion of the body defining a base region, comprising the steps of:

forming an oxide layer over said surface;

depositing a layer of metallic material over substantially the entire portion of the layer covering that part of the base region located between the emitter and collector regions;

heating said wafer to a selected temperature close to but less than the eutectic temperature of said metallic material and silicon for a selected period of time while the metallic layer is covering said part of the base region, so as to increase the current gain of the transistor; and after heating, providing an opening in said oxide layer above each of said regions, and an electrode passing through each opening to ohmically contact said regions.

5. A method of increasing the current gain $\beta$ of a bipolar lateral transistor structure as recited in claim 4 and further comprising the steps of:

providing openings in said oxide layer over selected ones of said regions before said layer of metallic material is deposited; and removing certain portions of said layer of metallic material after said heating step leaving the remaining portions of said layer of metallic material to provide ohmic contacts to said selected ones of said regions.

6. A method of increasing the current gain $\beta$ of a bipolar lateral transistor structure as recited in claim 4 wherein said temperature is selected from the range between 550° and 570° C., and said period of time is selected from the range between 30 minutes and 15 minutes.

* * * * *